United States Patent [19]

Haskell

[11] 4,041,329
[45] Aug. 9, 1977

[54] MANUALLY SELECTABLE SWITCH ARRAYS

[75] Inventor: Harry Ainsworth Haskell, Ashford, England

[73] Assignee: AEP-International Ltd., Staines, England

[21] Appl. No.: 637,406

[22] Filed: Dec. 3, 1975

[30] Foreign Application Priority Data

Dec. 5, 1974 United Kingdom ............... 52752/74

[51] Int. Cl.² .......................................... H03K 17/16
[52] U.S. Cl. ................... 307/247 A; 307/241; 328/152
[58] Field of Search ................. 307/241, 242, 247 A, 307/247 R; 328/152

[56] References Cited

U.S. PATENT DOCUMENTS

| | | | |
|---|---|---|---|
| 3,388,265 | 6/1968 | Wright | 307/247 A |
| 3,560,939 | 2/1971 | Lukacs | 307/241 X |
| 3,626,203 | 12/1971 | Bartlett | 307/247 A |

Primary Examiner—John S. Heyman

[57] ABSTRACT

A manually operable selector switch assembly comprises a plurality of manually operable switch means, a plurality of electrical switching circuits, and a corresponding plurality of bistable devices, one individual to each switching circuit and adapted in its set and reset states respectively to latch the switching circuit in an actuated condition and to place it in an inoperative condition. Each manually operable switch means is adapted upon operation thereof to provide two output signals a first one of which is fed to a single selected bistable device and the second of which is fed to all the bistable devices. The bistable devices are so constructed that only that one which receives both output signals is caused to be set, those which receive only the second output signal being restored to or remaining in their reset conditions. At least the second output signal is derived from a pulse generating circuit in such a manner as to prevent faulty operation of the bistables by transients generated due to contact bounce in the manual switch.

2 Claims, 9 Drawing Figures

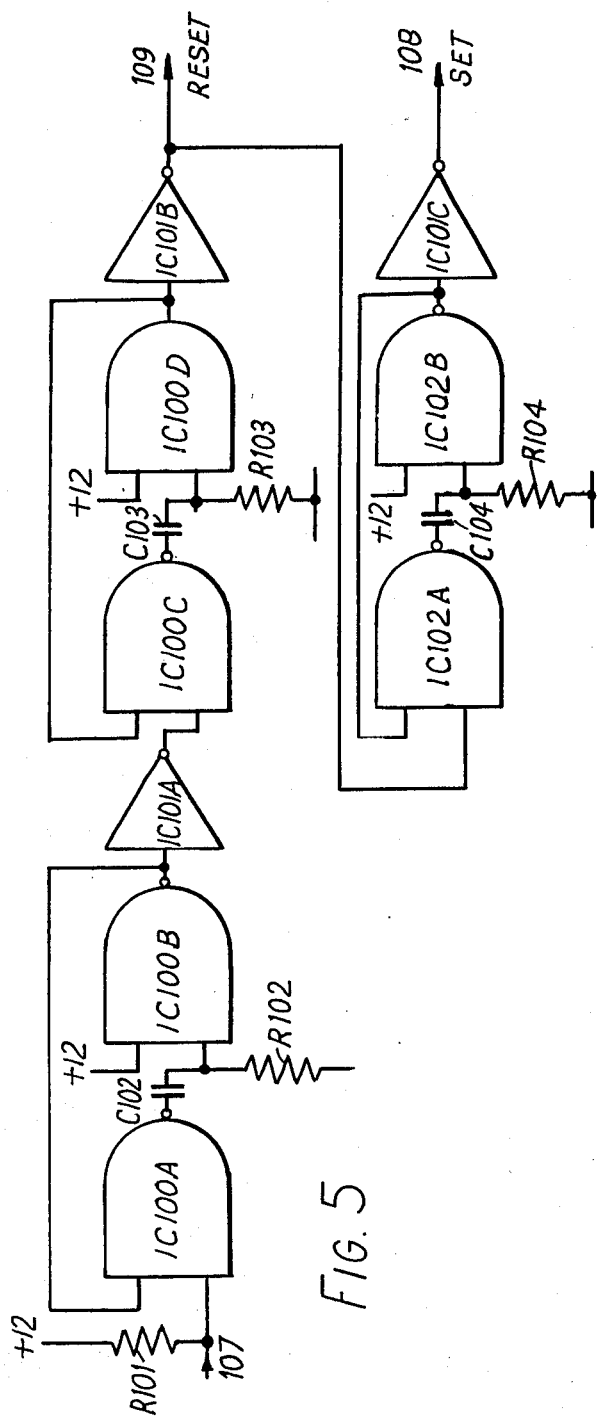
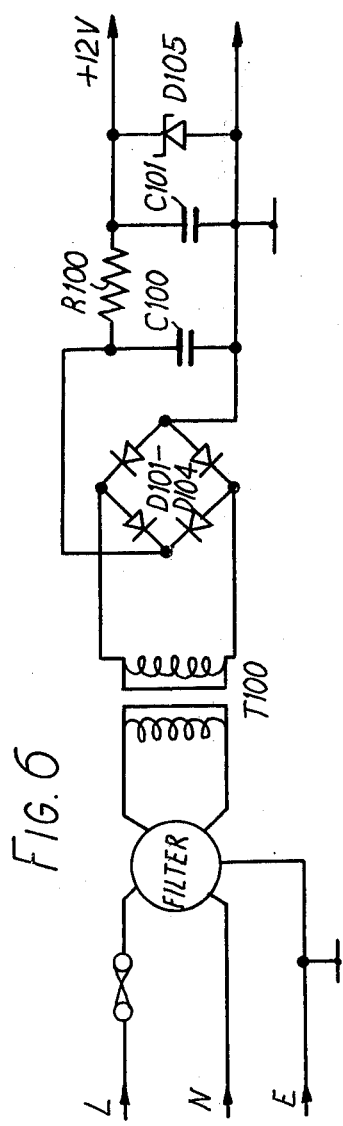
FIG. 5
FIG. 6

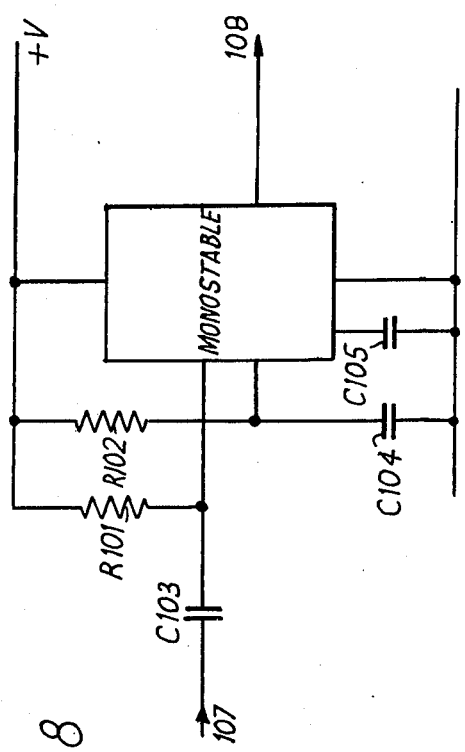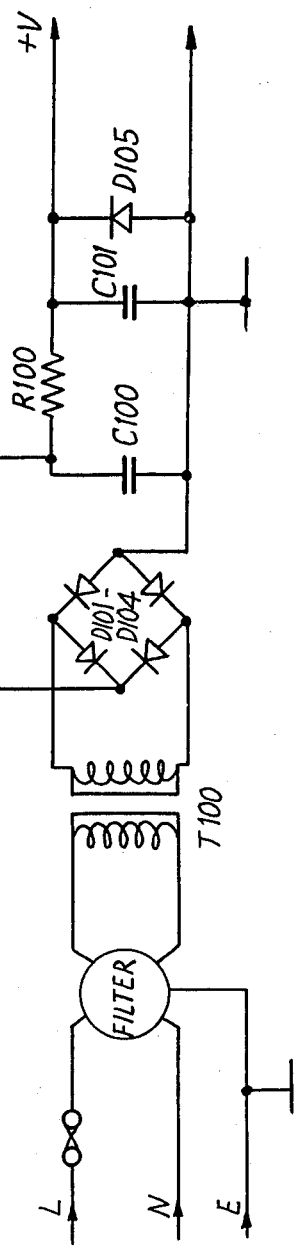
FIG. 8
FIG. 9

MANUALLY SELECTABLE SWITCH ARRAYS

BACKGROUND OF THE INVENTION

1. Field of the Invention

This invention concerns a manually actuatable selector switch array, and relates more especially to a selector switch array comprising a plurality of push buttons or equivalent actuating means, operation of any one of which is effective to actuate a corresponding electrical switching means whilst clearing any switching means which remain in a previously actuated condition.

2. Description of the Prior Art

In switch assemblies of this type, it is conventional to provide a mechanical link between the respective manually operable means, whereby upon actuation thereof, each is latched in its actuated position by a corresponding latching means, the latching means being linked to all the manually operable means in such a manner that its movement to latch a manually actuated means is effective to release any previously actuated means from the latched condition. Mechanically linked push button arrays of this type have the disadvantage that the latching mechanism is space consuming, is subject to malfunction as a result of wear or misalignment of moving parts, and is only applicable to a relatively limited number of push buttons. Moreover, a given latching mechanism is manufactured to accommodate a predetermined number of push buttons in the array, so that variation of the number of buttons in an array to suit individual requirements is not possible.

SUMMARY OF THE INVENTION

It is accordingly an object of the invention to provide a manually operable self-latching selector switch means in which the conventional mechanical linkage is replaced by an electronic circuit performing the latching function. It is a further object of the invention to provide means whereby mis-operation of the electronic circuit by transients generated in the mechanical switch is prevented.

In accordance with the invention there is provided a manually actuatable selector switch assembly comprising a plurality of individual electrically operable switching circuits, a bistable device individual to each switching circuit and having an output adapted to operate the electrical switching circuit, a plurality of manually actuatable switch means corresponding in number to said electrically operable switching circuits, and a monostable pulse generating circuit. Each of the manual switch means is a double pole switch having one pole connected in common with the other manual switch means for operation of the monostable circuit, and the other pole connected to mark the selected bistable for subsequent setting by a pulse from the monostable circuit.

The arrangement according to the invention has the advantage that actuation of a given electrical switching circuit, latching of said circuit in an actuated condition, and resetting of any previously latched circuits is carried out electronically simply in response to momentary actuation of a corresponding manual switch means, without the requirement for any mechanical linkage interconnecting the manually actuatable switch means. Moreover, since setting and resetting of the bistables is effected by the monostable circuit after actuation of the mechanical switch and termination of any contact bounce, mis-operation of the electronic circuit by transients is prevented. Thus selective manual actuation of a given switching circuit is rendered more reliable, and the avoidance of any requirement for mechanical interconnection of the manual switch means enables flexible adaptation of the number of switch means in a given array to be effected in order to tailor the array to given requirements, the same basic components being usable to build up an array of any given size. Components of an assembly in accordance with the invention may be grouped into modules allowing construction of an assembly comprising any multiple of a predetermined number of switch means, in a simple manner. Thus, a plurality of manually operable push buttons together with corresponding bistables and electrical switching circuits may be assembled on a wiring card together with the associated pulse generating circuit, to form a master card which may be supplemented by any number of slave cards each comprising a further plurality of push buttons, bistables, and electrical switching circuits, ready to be wired electrically in parallel with the corresponding components of the master card.

An assembly according to the invention is particularly applicable, for example, to an input selector device intended for use in selectively connecting any one of a plurality of inputs connected to the outputs of sensors such as a thermocouple, resistance thermometer, or other element, to a common output to a suitable read out instrument for supplying a reading of the parameter sensed by the sensor element. However, the invention should not be considered as being limited to any such use, and may be applied generally to any arrangement where the selective actuation of one of a plurality of electrical circuits is desired.

DESCRIPTION OF PREFERRED EMBODIMENTS OF THE INVENTION

Figure 1:
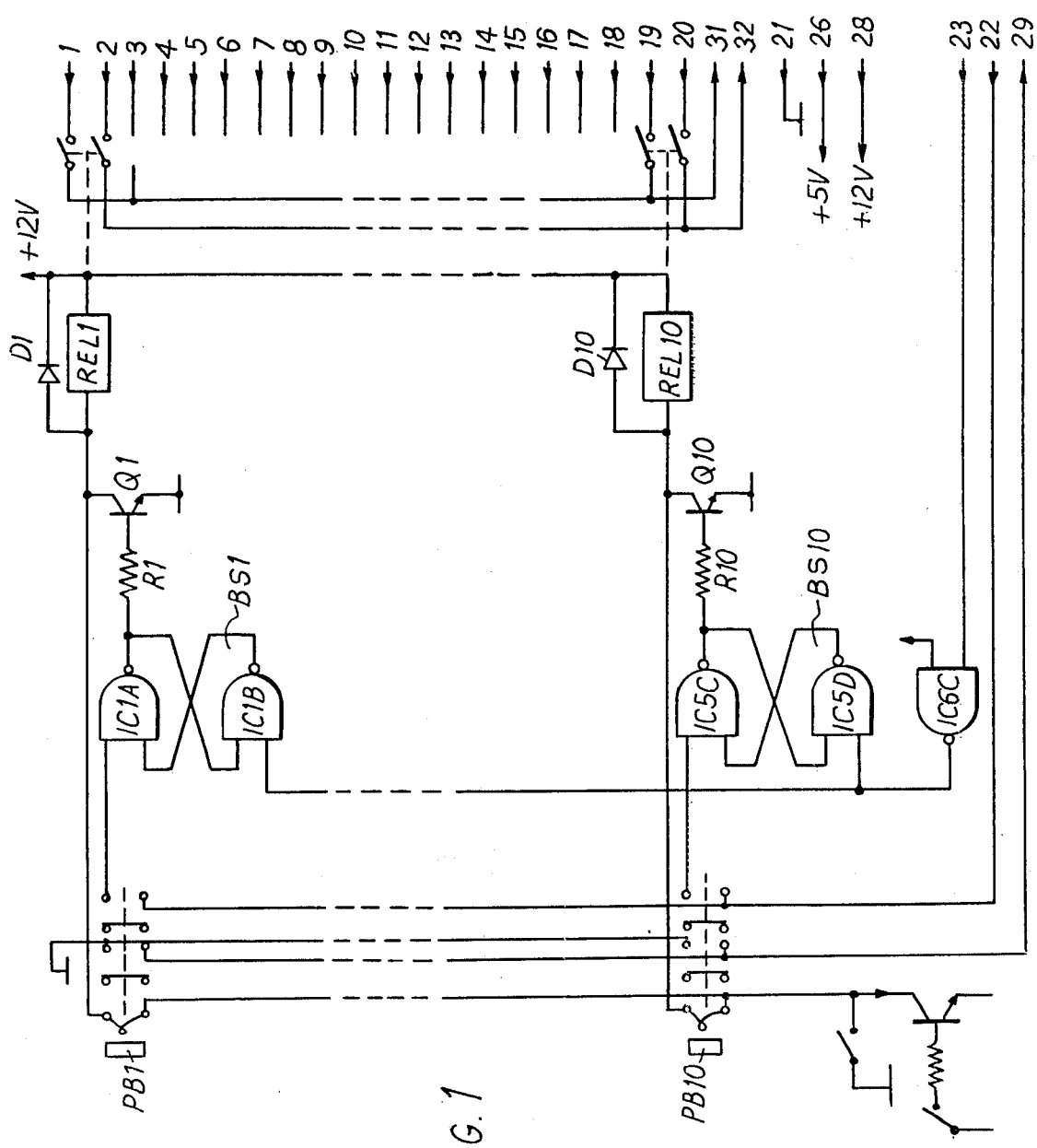
FIGS. 1 to 3 together make up a circuit diagram of one embodiment of a selector switch assembly according to the invention, FIGS. 4 to 6 together make up a circuit diagram of another embodiment of a selector switch assembly according to the invention, FIGS. 7 to 9 together make up a circuit diagram of a further embodiment of a selector switch assembly according to the invention.

Referring to FIG. 1 of the drawings, a selector switch portion of an apparatus according to the invention comprises 20 input terminals 1 to 20, arranged to be connected selectively in pairs to a single pair of output terminals 31, 32, by means of the contacts of any one of a plurality of two or more pole reed relays REL1 to REL10. The winding of each relay is connected in series between a source of positive potential and earth, by way of the emitter collector current path of a corresponding switching transistor Q1 to Q10. In addition the coil of each relay is shunted by a diode D1 to D10 to provide protection for the transistor Q1 to Q10 against transient signals induced in the relay coil winding. The base of each transistor Q1 to Q10 is connected, via a resistor R1 to R10, to the output of a bistable circuit BS1 to BS10 formed by a pair of interconnected NAND gates, the arrangement being such that an input to one gate, for example the upper input to gate IC1A, forms a set input for the bistable, and an input to the other gate, for example the lower input to gate IC1B, forms a reset input. Thus a signal on the set input causes the bistable to produce an output signal which renders the corresponding transistor conductive and thus energises its associated relay, whereas an input signal to the reset input of the bistable causes the transistor to be rendered non-conductive. All the reset inputs of the bistables BS1 to BS10 are connected in common to the output of a NAND gate IC6C, one input of which is connected to a source of positive potential, and the other of which is connected to an input terminal 23. The set inputs of the respective bistables BS1 to BS10 are each individually connected to one of a first pair of contacts of a corresponding double pole, double throw push button switch PB1 to PB10. The other ones of said first pair of contacts are all connected in common to an input terminal 22. The second pairs of contacts of the switches PP1 to PB10 are all connected in common, one side of the switch being connected to earth, and the other to an output terminal 29. The push button switches PB1 to PB10 are of the type including an indicator lamp, and the latter is connected in parallel with the winding of a corresponding one of the relays REL1 to REL10.

Figure 2:
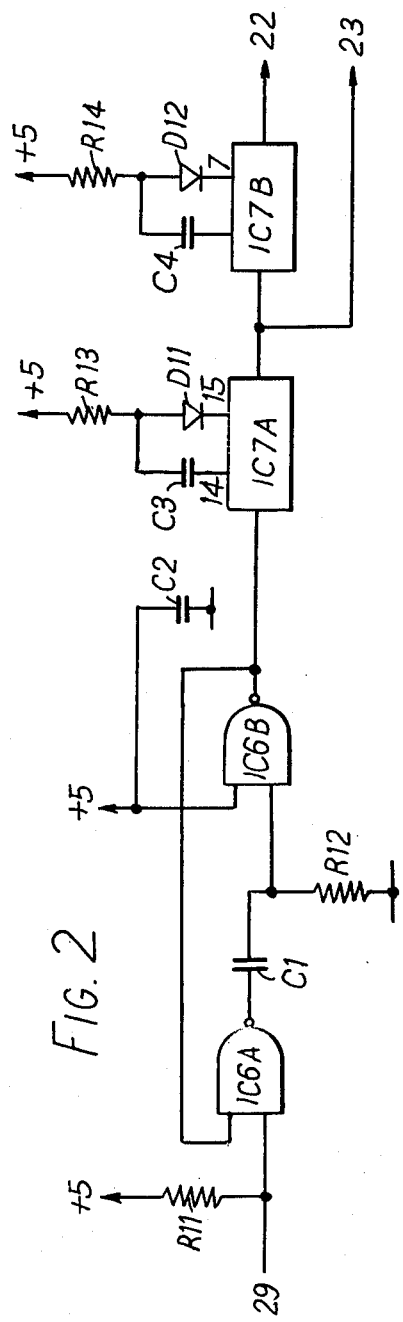

Referring now to FIG. 2, there is shown a master control circuit which is complementary to the switching section of the assembly shown in FIG. 1. An input to the circuit at the lefthand side of FIG. 2 is connected to the output 29 of FIG. 1, and outputs at the right-hand side of the circuit are connected to inputs 22 and 23 of FIG. 1, as shown. The master control circuit comprises a pair of NAND gates IC6A and IC6B, interconnected as shown so that in response to application of an earth potential at terminal 29, a negative going pulse is produced at the output of the NAND gate IC6B. This pulse initiates a monostable IC7A, which then produces at its output a pulse which is applied to the terminal 23 and the input of a further monostable IC7B. The monostable IC7B accordingly produces a further pulse at terminal 22, at a predetermined time after the application of the pulse to terminal 23.

Figure 3:
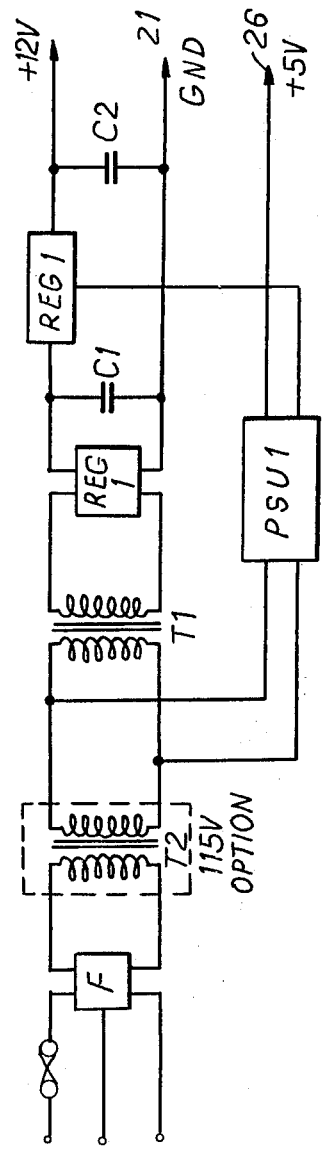

FIG. 3 shows a power supply unit consisting of a five volt one amp d.c. protected and regulated module, and a twelve volt hundred milliamp d.c. output from a standard mains transformer, bridge rectifier and regulating integrated circuit. The corresponding outputs of the power supply are applied to terminals 21, 26 and 28 of the circuit shown in FIG. 1. The power supply also provides the five volt positive and earth terminals shown in FIG. 2.

The operation of the device described above will now be described as follows. A complete assembly incorporating the system described above will normally be built up of modules comprising a master card unit incorporating all of the components shown in FIGS. 1 to 3, and one or more additional slave card units incorporating only the components shown in FIG. 1, and connected in parallel with the respective terminals 1 to 31. Thus the complete assembly may provide for an input selector switch assembly having any number of inputs. In order to select a particular input for connection to terminals 31 and 32, a corresponding one of the push buttons PB1 to PB10 is momentarily depressed. As a result, the terminal 29 receives earth potential. The NAND gates IC6A and IC6B thus respond to produce a negative going pulse of such a length as to counteract any contact bounce or false contacts of the manually operated push button. In response to this negative going pulse, consecutive signal pulses are produced at the terminals 23 and 22 as already described above. The pulse applied at terminal 23 causes the NAND gate IC6C, which acts as a fan-out buffer inverter, to apply a corresponding signal to the reset inputs of all the bistables BS1 to BS10, thus deenergising any of the relays REL1 to REL10 that have been latched as a result of actuation of a previous push button. The pulse applied at terminal 22 is then passed via the contacts of the depressed push button to the set input of the corresponding one of the bistables BS1 to BS10. The corresponding bistable is thus triggered into a state such that a five volt positive potential is applied to the base of the associated one of the transistors Q1 to Q10, as a result of which the transistor becomes conductive and completes a current path for energisation of the corresponding relay. The relay remains latched in the energised condition until a further signal is applied at the reset input of the appropriate bistable. It will be appreciated that the push button must be held in the depressed condition until the pulse applied at terminal 22 is effective to set the selected bistable. The duration of the pulses from the master control circuit need only be a matter of milliseconds however, and therefore the natural action of manual movement of the button will provide ample time for actuation of the circuit. It will be noted that energisation of any one of the transistors Q1 to Q10 also completes a current path from the twelve volt positive supply via the pilot lamp associated with the corresponding push button switch, and illumination of the pilot lamp accordingly provides a warning indication that the relay switch actuated by that push button has been latched into an energised condition and that the corresponding input of the switch assembly has been selected.

From the above description, it will be seen that there is provided a push button selector switch assembly enabling reliable connection of any one of from ten to, for example, one hundred inputs to a single output, actuation, latching and resetting of the switch means being effected electronically without the requirement for any mechanical linkage of the push buttons.

Figure 4:
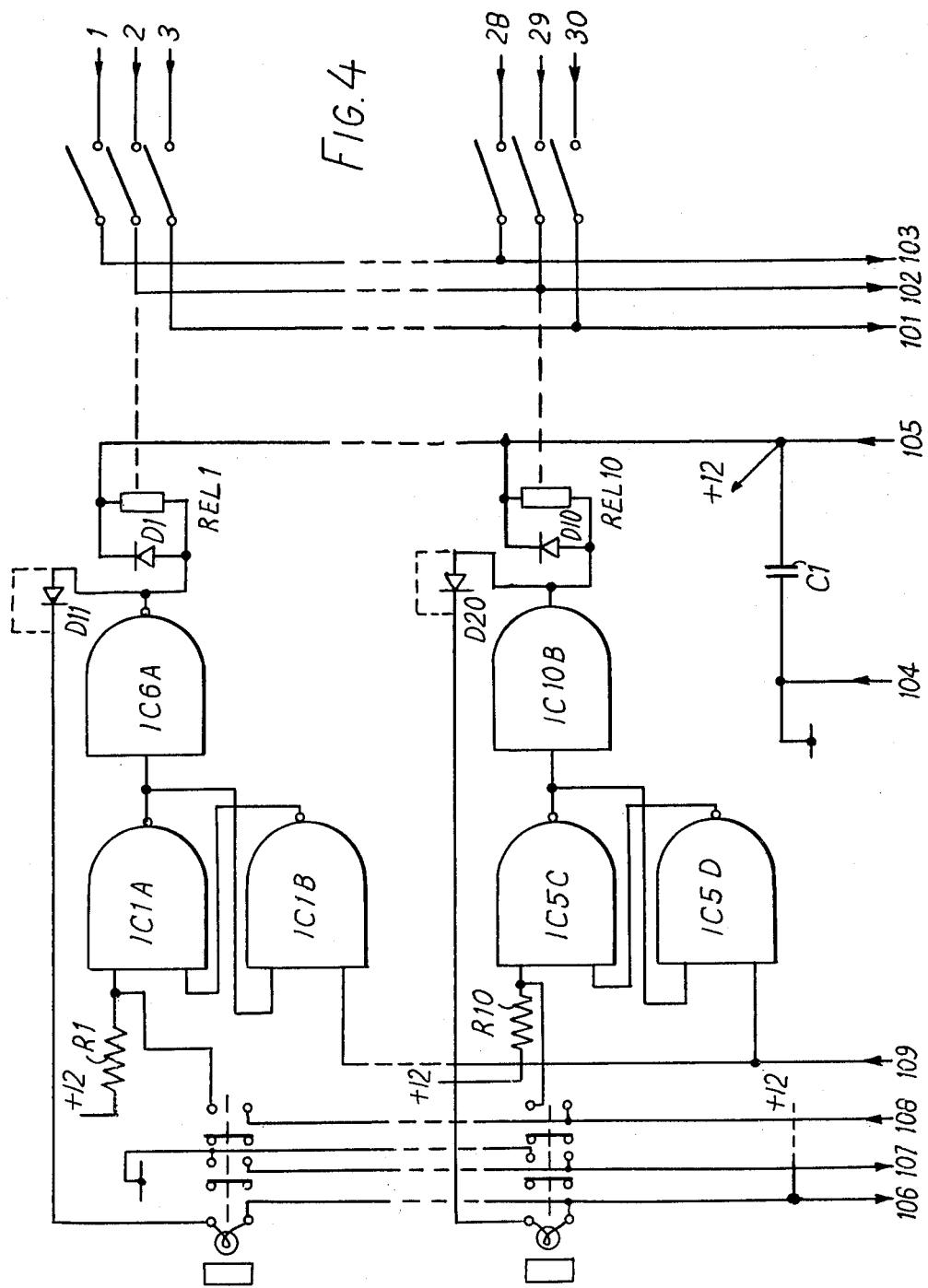
Figure 7:
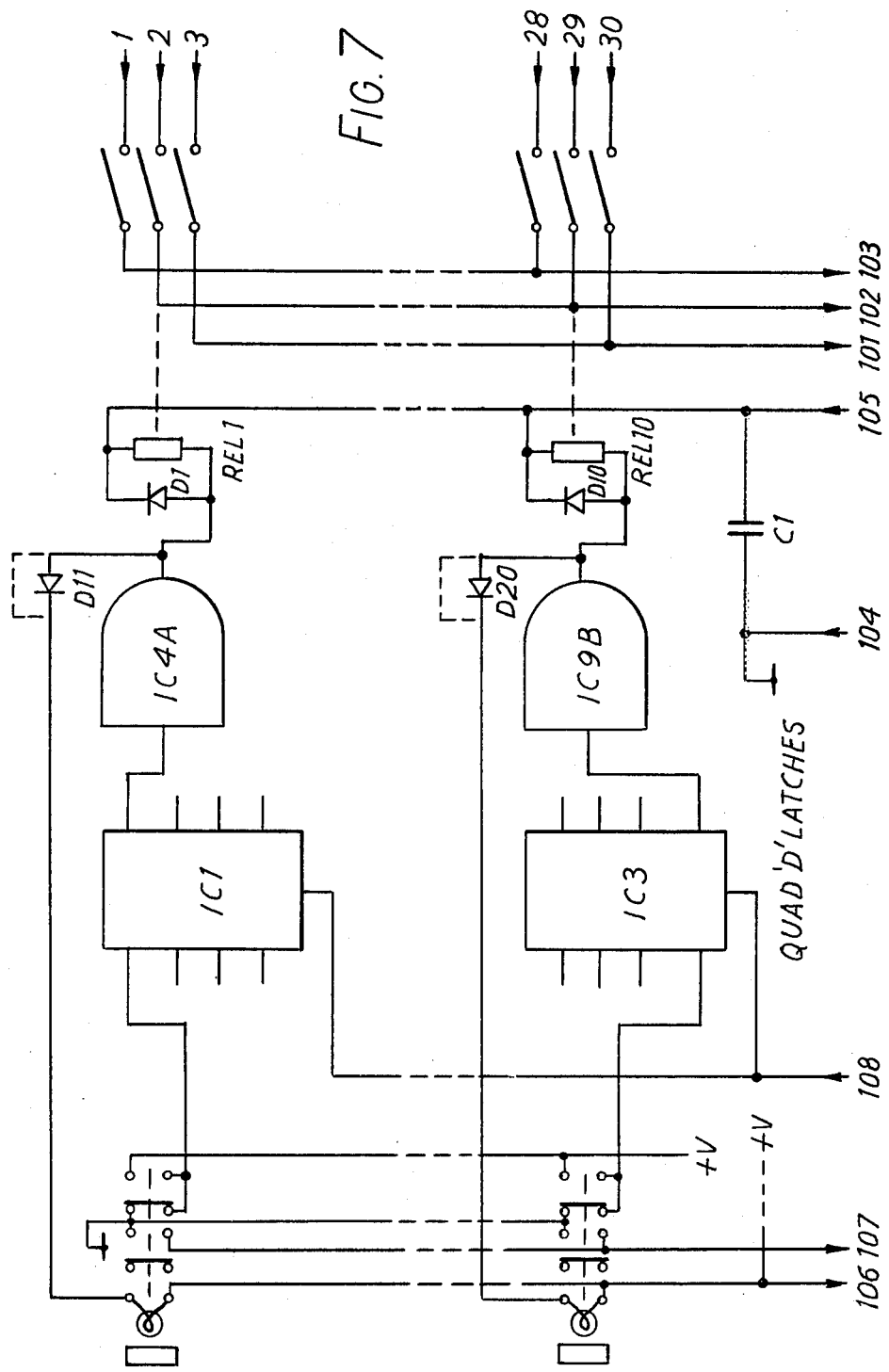

It will be appreciated that various modifications of the above described arrangement will be apparent to those skilled in the art, for example to adapt the circuit of the switch array for construction by means of any readily available electronic components capable of performing an equivalent function to components of the circuit specifically described above. Many such modifications and alterations may be made without departing from the scope of the invention as initially defined above. Thus as shown in FIGS. 4 to 6 of the accompanying drawings, the circuit of FIGS. 1 to 3 is adapted to use alternative components. In particular, the transistors of FIG. 1 are replaced by logic elements performing an equivalent function. As shown in FIGS. 7 to 9, the circuit is further adapted to enable the use of bistable elements of a different type from that shown in FIG. 4. in FIG. 7, the integrated circuit elements IC1 to IC3 each provide four bistable devices, each having a single input at the left-hand side of the element as viewed in the drawings, a single output at the right-hand side, and a further input common to all four devices at the base of the element. The bistable devices in this embodiment of the invention are of the type such that the state of the device is governed by the state of the signal received at the left-hand input at the time when an actuating signal is applied at the common input at the base of the element. The state of the signal at the left-hand input is governed by the state of the corresponding manually actuatable switch, which has a changeover contact the respective poles of which are connected respectively to sources of positive and earth potential. The common inputs of all of the bistables are connected to an output 108 from a monostable device having an input 107 connected to receive earth potential from the other contact of each switch means. Therefore, when a switch means is manually actuated, firstly the polarity at the input to a corresponding one of the bistables is changed from earth to positive potential, and secondly, in response to closure of the other contact of the switch the monostable shown in FIG. 9 is caused to provide at the output 108 a pulse applied in common to all of the bistable devices. Since only the bistable corresponding to the actuated switch has a positive potential at its input, that bistable will be placed in a set condition and a corresponding positive potential will appear at the output thereof. All the remaining bistables will have their inputs held at earth potential by the corresponding unactuated switches, and therefore upon receipt of the pulse from the output 108, the pulse will, depending on the state of the bistable, either be ineffective or reset the bistable.

What is claimed is:

1. A manually actuatable selector switch assembly comprising:
   a. a plurality of bistable devices each having a set input, a reset input and an output which provides a signal having a first signal potential when the bistable is in the set condition and a second signal potential when the bistable is in the reset condition,
   b. a plurality of electrical switching circuits each of which has a control terminal connected to the output of a corresponding one of said bistable devices whereby said switching circuit is rendered operative in response to the presence of said first signal potential at the output of the corresponding bistable,
   c. a plurality of double pole manually actuatable push button switches each having two pairs of contacts adapted to be closed upon depression of the push button, of which a first contact of one pair in each switch is connected to the set input of a different one of said bistable devices, and of which first contacts of the second said pairs in all said switches are connected in common to a source of signal potential, and
   d. a monostable pulse generating circuit having an input and first and second outputs, said monostable circuit providing in response to a signal received at its input two output pulses at said first and second outputs respectively, said pulses being spaced in time such that the pulse at said first output occurs before the pulse at said second output, the input of said monostable circuit being connected in common to the second contacts of the said second pairs in all said push button switches, the said first output being connected in common to the reset inputs of all said bistable devices, and the said second output being connected in common to the second contacts of the said first pairs in all said push button switches.

2. A manually actuatable selector switch assembly, comprising:
   a. a plurality of bistable devices each having a first signal input, a second signal input and a signal output, the signal potential at said signal output being set at a first level or a second level in dependence upon the signal applied to said first signal input when a control signal is applied to said second signal input,
   b. a plurality of electrical switching circuits each of which has a control terminal connected to the output of a corresponding one of said bistable devices whereby said switching circuit is rendered operative in response to the presence of said first signal potential at the output of the corresponding bistable,
   c. a plurality of double pole manually actuatable push button switches each having two pairs of contacts adapted to be closed upon depression of the push button, of which a first contact of one pair in each switch is connected to the first signal input of a different one of said bistable devices, the second contacts of said one pairs in all of said switches are connected in common to a source of signal potential and first contacts of the second pairs in all of said switches are connected in common to a source of signal potential, and
   d. a monostable pulse generating circuit having an input and an output, said circuit providing a signal pulse of predetermined duration at its output in response to a signal provided at its input, the input of said monostable circuit being connected in common to the second contacts of the second pairs in all of said switches, and the output of said monostable circuit being connected in common to the second signal inputs of all of said bistable devices.

* * * * *